(12) United States Patent
Koda et al.

(10) Patent No.: US 6,233,442 B1
(45) Date of Patent: May 15, 2001

(54) HIGH FREQUENCY APPARATUS WITH REDUCED ADJUSTING ERROR

(75) Inventors: Tsutomu Koda; Akira Mishima, both of Gifu; Tetsuya Ozaki; Seiji Matsushita, both of Aichi, all of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/144,729

(22) Filed: Sep. 1, 1998

(30) Foreign Application Priority Data

Sep. 12, 1997 (JP) .................................................. 9-248054

(51) Int. Cl.⁷ .................................................. H04B 1/26
(52) U.S. Cl. .......................................... 455/266; 455/254
(58) Field of Search .............................. 455/323, 188.1, 455/188.2, 266, 254; 333/175, 176, 174, 175.1, 176.1, 170.1

(56) References Cited

U.S. PATENT DOCUMENTS

| | | | |
|---|---|---|---|
| 4,132,952 | * | 1/1979 | Hongu et al. ...................... 455/188.1 |
| 4,138,637 | * | 2/1979 | Weinert ................................. 323/354 |
| 4,385,402 | * | 5/1983 | Barrs ..................................... 455/339 |
| 4,571,560 | * | 2/1986 | Dobrovolny ........................... 333/174 |
| 4,654,610 | * | 3/1987 | Dasilva ................................. 333/81 R |
| 5,023,939 | * | 6/1991 | Hori ....................................... 455/188 |
| 5,483,209 | * | 1/1996 | Takayama ............................. 333/174 |
| 5,821,838 | * | 10/1998 | Suzuki et al. .......................... 334/47 |
| 5,893,025 | * | 4/1999 | Bessho et al. ......................... 455/6.2 |
| 5,930,696 | * | 7/1999 | Tzuang et al. ........................ 455/311 |

* cited by examiner

*Primary Examiner*—Edward F. Urban
*Assistant Examiner*—Blane J. Jackson
(74) *Attorney, Agent, or Firm*—Pearne & Gordon LLP (57) ABSTRACT

A high frequency apparatus includes an input terminal 21, a high frequency filter 22 to which a signal input into the input terminal 21 is supplied, a mixer 24, one input of which an output signal of the high frequency filter 22 is supplied to and an other input of which an output signal of a local oscillator 23 is supplied to, an intermediate frequency filter 25 to which an output signal of the mixer 24 is supplied, an output terminal 27 to which an output signal of the intermediate frequency filter 25 is supplied, and an electronic switch 30. The electronic switch is provided in the vicinity of the intermediate frequency filter 25, for making a passband characteristic of the intermediate frequency filter 25 substantially flat by closing both contacts, wherein opening and closing of the electronic switch 30 is controlled externally. Accordingly, the adjusting error of the high frequency filter can be reduced.

5 Claims, 7 Drawing Sheets

FIG. 9C ular. Also, since control of the electronic switch can be

HIGH FREQUENCY APPARATUS WITH REDUCED ADJUSTING ERROR

BACKGROUND OF THE INVENTION

The present invention relates to a high frequency apparatus having an adjusting element.

Figure 8:
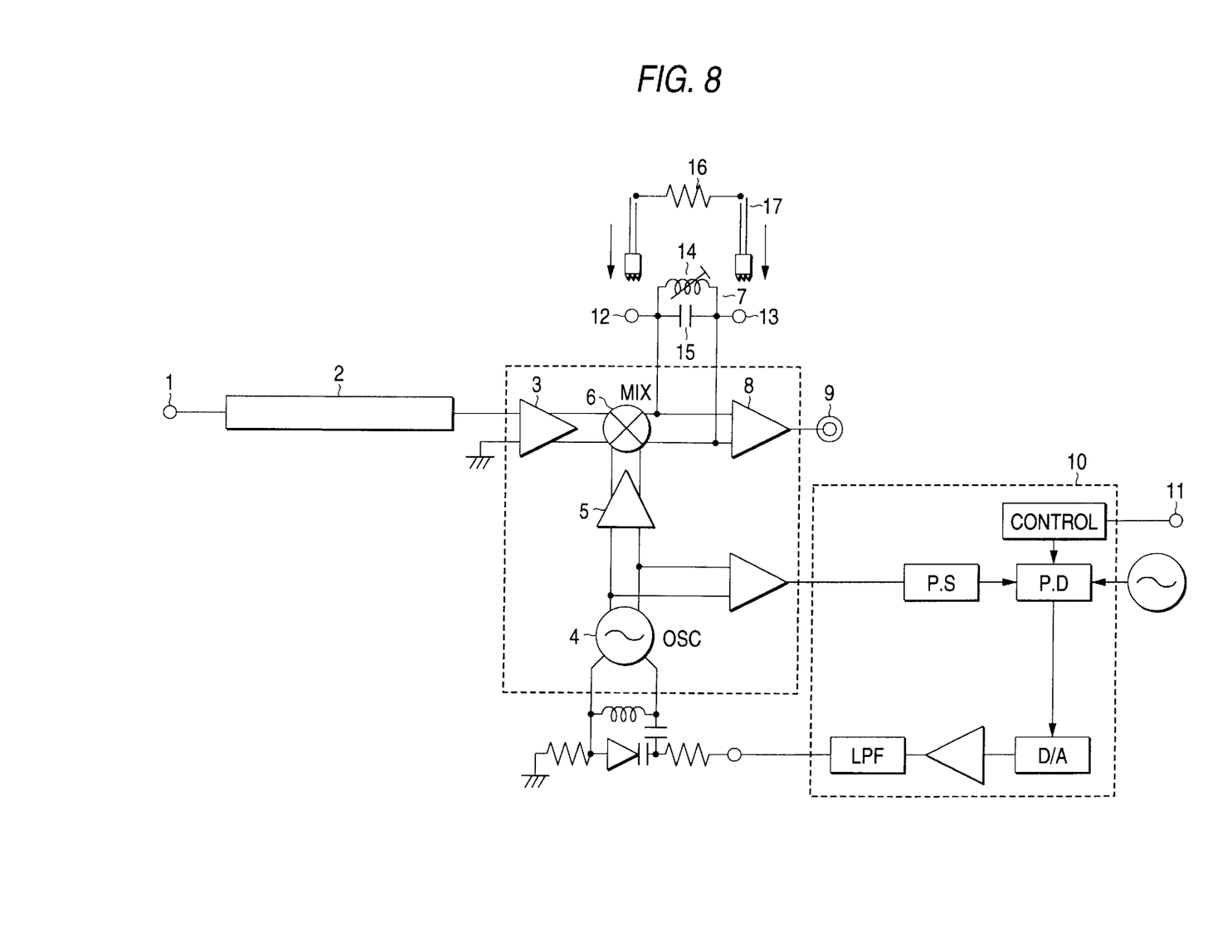
FIG. 8 is a block circuit diagram showing a conventional high frequency apparatus.

A conventional high frequency apparatus will be explained hereinafter. As shown in FIG. 8, the conventional high frequency apparatus has been constructed to comprise an input terminal 1 to which a high frequency signal is input, a bandpass filter 2 connected to the input terminal 1, an unbalance-balance converter 3 connected to an output of the bandpass filter 2, a balanced mixer 6 one input of which an output of the unbalance/balance converter 3 is connected to and other input of which an output of a voltage-controlled oscillator 4 is connected to via a buffer 5, an intermediate frequency filter 7 connected between both outputs of the balanced mixer 6, a balance-unbalance converter 8 connected to the intermediate frequency filter 7, an output terminal 9 connected to an output of the balance-unbalance converter 8, a known PLL circuit 10 connected to the voltage-controlled oscillator 4, for controlling an oscillation frequency of the voltage-controlled oscillator 4, and a data input terminal 11 for supplying local oscillation frequency designating data to the PLL circuit 10. In addition, in order to adjust this high frequency device, test terminals 12, 13 are provided to both ends of the intermediate frequency filter 7 respectively.

An operation of the high frequency apparatus constructed as above will be explained hereinbelow. A high frequency signal input from the input terminal 1 is passed through the bandpass filter 2. The high frequency signal passed through the bandpass filter 2 is mixed with an output signal of the voltage-controlled oscillator 4, which is decided by the PLL circuit 10 according to a signal input from the data input terminal 11, by the balanced mixer 6 and then a signal having a sum or difference frequency is output from the balanced mixer 6. In other words, the high frequency signal input from the input terminal 1 can be tuned based on a data signal input from the data input terminal 11. A signal having a frequency bandwidth of 54.25 MHz to 58.75 MHz can be selected by passing the output of the balanced mixer 6 through the intermediate frequency filter 7, then converted into an unbalanced output by the succeeding balance-unbalance converter 8, and then output from the output terminal 9.

Figure 9A:
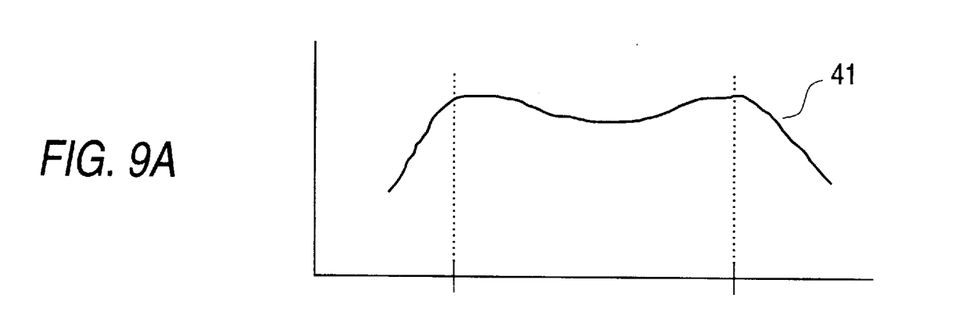
FIG. 9A is a characteristic curve view of a bandpass filter as a pertinent portion of the conventional high frequency apparatus.

The bandpass filter 2 is a high frequency filter which consists of an inductance and a capacitance and has a passband characteristic shown as a characteristic 41 in FIG. 9A. The high frequency signal is waveform-shaped to have such passband characteristic 41. The intermediate frequency filter 7 is composed of a parallel circuit of an inductance 14 and a capacitance 15 and has a passband characteristic shown as a characteristic 42 in FIG. 9B. The intermediate frequency signal is waveform-shaped to have such passband characteristic 42. However, since the bandpass filter 2 and the intermediate frequency filter 7 are connected in series with each other, an output waveform output from the output terminal 9 can be given by a synthesized waveform shown as a characteristic 43 in FIG. 3C. Because of an influence of the intermediate frequency filter 7, it has been difficult to adjust the bandpass filter 2 while monitoring such synthesized waveform 43, i.e., obtain the characteristic 41 shown in FIG. 9A. Therefore, after both ends 12, 13 of the intermediate frequency filter 7 have been short-circuited and dumped by a contactor pin 17 having a dumping resistor 16 so as to eliminate the influence of the intermediate frequency filter 7, the bandpass filter 2 has been adjusted while monitoring the output waveform output from the output terminal 9.

However, according to the above configuration, the influence of the intermediate frequency filter 7 has not been able to be completely eliminated because of variations of a length of the contactor pin 17 and the dumping resistor 16, a contact resistance of the contactor pin 17, or the like. As a consequence, an adjusting error of the bandpass filter 2 serving as the high frequency filter has been caused.

SUMMARY OF THE INVENTION

The present invention has been made to overcome the above problem and it is an object of the present invention to provide a high frequency apparatus in which the adjusting error of the high frequency filter can be reduced.

According to the present invention, a high frequency apparatus comprises: an input terminal, a high frequency filter to which a signal input into the input terminal is supplied, a mixer one input of which an output signal of the high frequency filter is supplied to and an other input of which an output signal of a local oscillator is supplied to, an intermediate frequency filter to which an output signal of the mixer is supplied, an output terminal to which an output signal of the intermediate frequency filter is supplied, and an electronic switch provided in a vicinity of the intermediate frequency filter. The electronic switch makes a passband characteristic of the intermediate frequency filter substantially flat by closing both contacts, wherein opening and closing of the electronic switch is controlled externally. Since the electronic switch is disposed in the vicinity of the intermediate frequency filter, the high frequency apparatus can be provided which includes no uncertain element like the contactor pin in the conventional devices and includes small adjusting error of the high frequency filter.

Further, since opening and closing of the electronic switch is carried out indirectly by the control signal externally, influence upon the high frequency signal passing through the intermediate frequency filter can be extremely reduced.

Moreover, there is no need of employing the contactor pin because the output terminal can be employed, so that production facilities can be simplified and also lower cost of the production facilities can be achieved.

Further, in the high frequency apparatus of the present invention, the mixer, local oscillator, and electronic switch are incorporated in a same integrated circuit. Since the electronic switch can be disposed in vicinity of a signal transmission line by building the electronic switch in the integrated circuit, the influence upon the high frequency signal passing through the intermediate frequency filter can be extremely reduced and they can be installed in the same integrated circuit. Hence, cost of the electronic switch can be reduced to a negligible extent and lower cost can be attained as a whole.

Furthermore, the high frequency apparatus of the present invention further comprises a PLL circuit connected to the local oscillator, oscillation frequency of the local oscillator is controlled by a signal which is input into the PLL circuit via a data input terminal and opening and closing of the electronic switch is also controlled. Since the control signal of the electronic switch can be derived from the data control terminal, there is no necessity of providing a control terminal for the electronic switch in the integrated circuit particularly. Also, since control of the electronic switch can be performed by the signal derived from the data control terminal, a testing contactor pin can be omitted and thus defective contact caused by the contactor pin can be eliminated. Further, since the contactor pin can be omitted, a testing jig can be reduced in size and a lower cost can be achieved.

Moreover, in the high frequency apparatus of the present invention, a balanced mixer is employed as the mixer, the intermediate frequency filter is connected between outputs of the balanced mixer, and a dumping resistor and the electronic switch are connected in series across both ends of the intermediate frequency filter. Since the balanced mixer is employed as the mixer, the high frequency apparatus is excellent in preventing external noises and is suited for the integrated circuit. In addition, the high frequency filter can be adjusted in the situation that the influence of the intermediate frequency filter can be reduced as much as possible by short-circuiting the output via the dumping resistor.

Still further, in the high frequency apparatus of the present invention, an unbalanced mixer is employed as the mixer, the intermediate frequency filter is connected between an output of the unbalanced mixer and ground, and a dumping resistor and the electronic switch are connected in series across both ends of the intermediate frequency filter. Since the unbalanced mixer is employed as the mixer, the high frequency apparatus can be implemented at low cost. Also, the high frequency filter can be adjusted by short-circuiting the output via the dumping resistor while reducing the influence of the intermediate frequency filter as much as possible.

Still further, according to the present invention, the high frequency apparatus comprising a plurality of parallel-connected bodies each of which is made of an electronic switch and an adjusting element and which are connected in series between an input and an output, opening and closing of the electronic switch is controlled by a signal which is supplied to a control terminal of the electronic switch. The adjusting element can be adjusted by opening only the electronic switch which is connected in parallel with the predetermined adjusting element and closing all electronic switches which are connected in parallel with other adjusting elements respectively. Similarly, all adjusting elements can be adjusted by executing the above operation sequentially.

Still further, according to the present invention, the high frequency apparatus comprising a plurality of series-connected bodies each of which is made of an electronic switch and an adjusting element and which are connected in parallel between an input and an output, wherein. Opening and closing of the electronic switch is controlled by a signal which is supplied to a control terminal of the electronic switch. The predetermined adjusting element can be adjusted by closing only the electronic switch which is connected in series with the predetermined adjusting element and opening all electronic switches which are connected in series with other adjusting elements, respectively. In a similar way, overall adjusting elements can be adjusted by executing the above operation sequentially.

DETAILED DESCRIPTION OF THE PREFERRED EMBODIMENTS

Embodiments of the present invention will be explained with reference to the accompanying drawings hereinafter.

Embodiment 1

Figure 1:
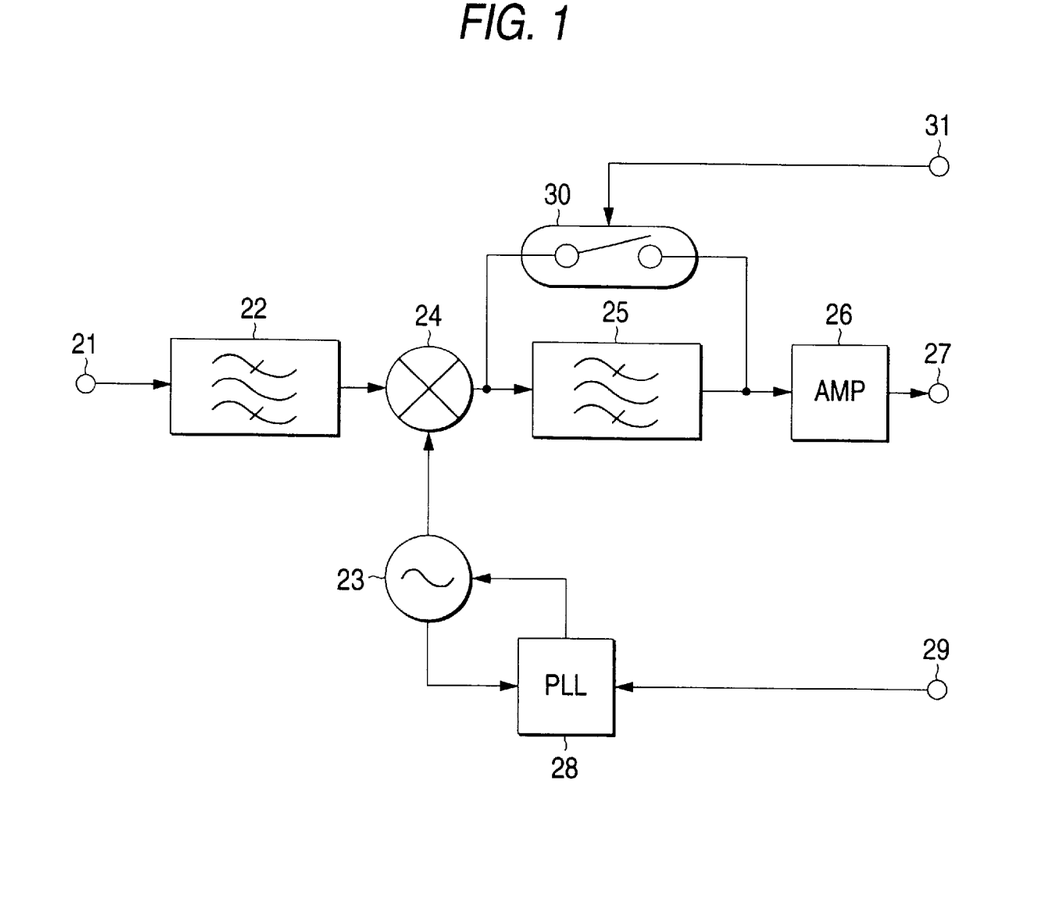
FIG. 1 is a block circuit diagram showing a high frequency apparatus according to a first embodiment of the present invention.

In FIG. 1, a high frequency apparatus of the present invention comprises an input terminal 21, a bandpass filter 22 (employed as an example of a high frequency filter) connected to the input terminal 21, an mixer 24, one input of which an output of the bandpass filter 22 is connected to and an other input of which an output of a local oscillator 23 is connected to, an intermediate frequency filter 25 to which an output of the mixer 24 is connected, an intermediate frequency amplifier 26 to which an output of the intermediate frequency filter 25 is connected, an output terminal 27 to which an output of the intermediate frequency amplifier 26 is connected, a PLL circuit 28 loop-connected to the local oscillator 23, a data input terminal 29 connected to the PLL circuit 28, an electronic switch 30 provided in a vicinity of the intermediate frequency filter 25 and connected across both ends of the intermediate frequency filter 25, and a control terminal 31 for controlling opening and closing of the electronic switch 30.

An operation of the high frequency apparatus constructed as above will be explained hereinbelow. A high frequency signal input from the input terminal 21 is passed through the bandpass filter 22. The high frequency signal passed through the bandpass filter 22 is mixed with an output signal of the local oscillator 23, which is decided by the PLL circuit 28 according to a signal input from the data input terminal 29, by the mixer 24 and then a signal having a sum or difference frequency is output from the mixer 24. In other words, the high frequency signal input via the input terminal 21 can be tuned based on a data signal input via the data input terminal 29. A signal having a frequency bandwidth of 54.25 MHz to 58.75 MHz can be selected when the output of the mixer 24 is passed through the intermediate frequency filter 25, then amplified by the succeeding intermediate frequency amplifier 26, and then output from the output terminal 27.

Figure 9B:
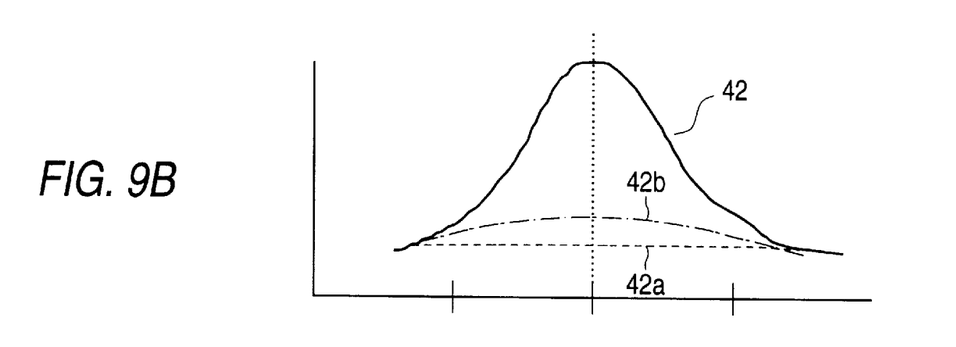
FIG. 9B is a characteristic curve view of an intermediate frequency filter as another pertinent portion of the conventional high frequency apparatus.
Figure 9C:
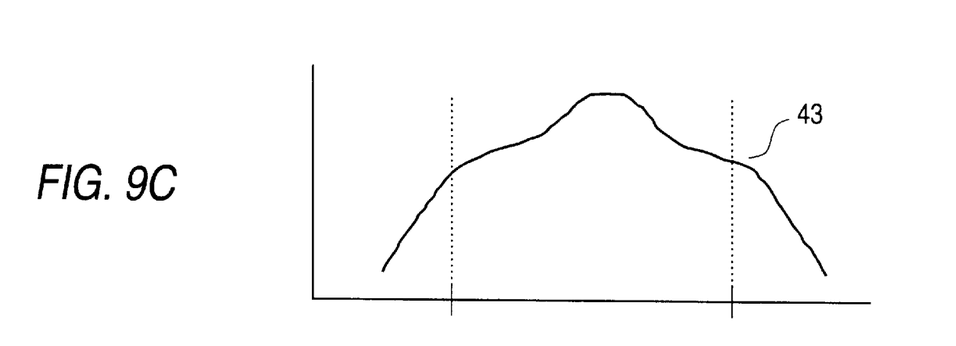
FIG. 9C is a characteristic curve view of a synthesized output waveform in the conventional high frequency apparatus.

The bandpass filter 22 and the intermediate frequency filter 25 consist of an inductance and a capacitance respectively and have passband characteristics shown as the characteristic 41 in FIG. 9A and the characteristic 42 in FIG. 9B respectively. Therefore, respective signals can be waveform-shaped to have such passband characteristics 41 and 42. In other words, after a characteristic of the intermediate frequency filter 25 is made flat, as indicated by 42a, by closing the electronic switch 30 by using the signal supplied from the control terminal 31, the bandpass filter 22 can be adjusted while monitoring the output from the output terminal 27 such that an output waveform of the bandpass filter 22 coincides with the passband characteristic 41 as it is. After this adjustment has been finished, the electronic switch 30 is opened. In this manner, since the electronic switch 30 is provided in vicinity of the intermediate frequency filter 25, the high frequency apparatus which includes no uncertain element and has small adjusting error of the bandpass filter 22 can be provided.

Embodiment 2

Figure 2:
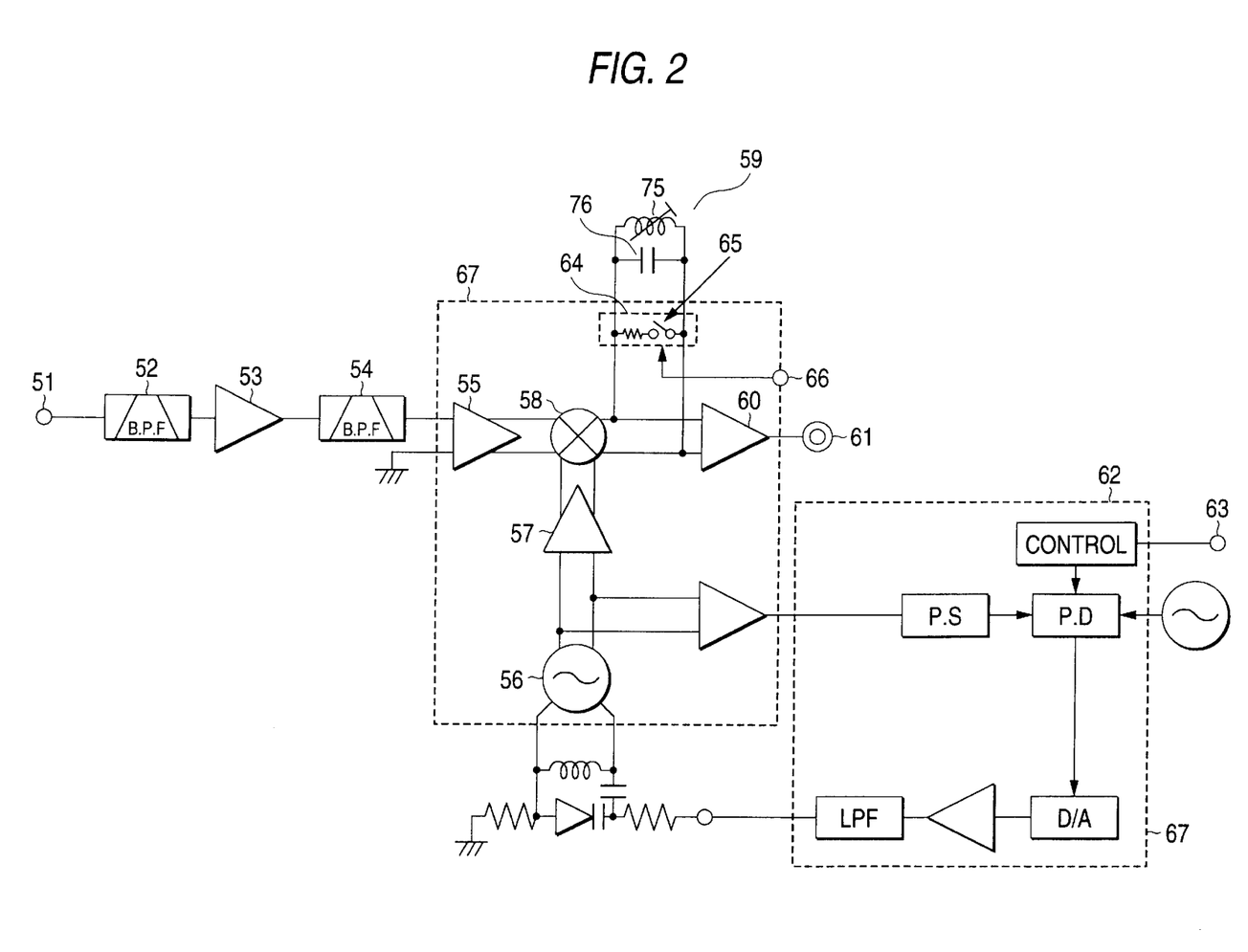
FIG. 2 is a block diagram showing a high frequency apparatus according to a second embodiment of the present invention.

FIG. 2 is a block circuit diagram showing a high frequency apparatus according to a second embodiment of the present invention. As shown in FIG. 2, the high frequency apparatus according to the second embodiment comprise: an input terminal 51 to which a high frequency signal is input; a broad-band bandpass filter 52 connected to the input terminal 51; a high frequency amplifier 53 connected to an output of the broad-band bandpass filter 52; a narrow-band bandpass filter 54 connected to an output of the high frequency amplifier 53; an unbalance-balance converter 55 connected to an output of the narrow-band bandpass filter 54; a balanced mixer 58, one input of which an output of the unbalance-balance converter 55 is connected to and, other input of which an output of a local oscillator 56 is connected to via a buffer 57; an intermediate frequency filter 59 connected between both output terminals of the balanced mixer 58; a balance-unbalance converter 60 connected to the intermediate frequency filter 59; an output terminal 61 connected to an output of the balance-unbalance converter 60; a known PLL circuit 62 connected to the local oscillator 56, for controlling an oscillation frequency of the local oscillator 56; and a data input terminal 63 for supplying local oscillation frequency designating data to the PLL circuit 62, and an electronic switch 65 connected in series across both ends of the intermediate frequency filter 59 via a dumping resistor 64 (almost 50Ω). A reference 66 denotes a control terminal of the electronic switch 65.

The unbalance-balance converter 55, the local oscillator 56, the buffer 57, the balanced mixer 58, the balance-unbalance converter 60, the dumping resistor 64, and the electronic switch 65 are incorporated into a first integrated circuit 67. Also, the PLL circuit 62 is incorporated into a second integrated circuit 68.

Figure 3:
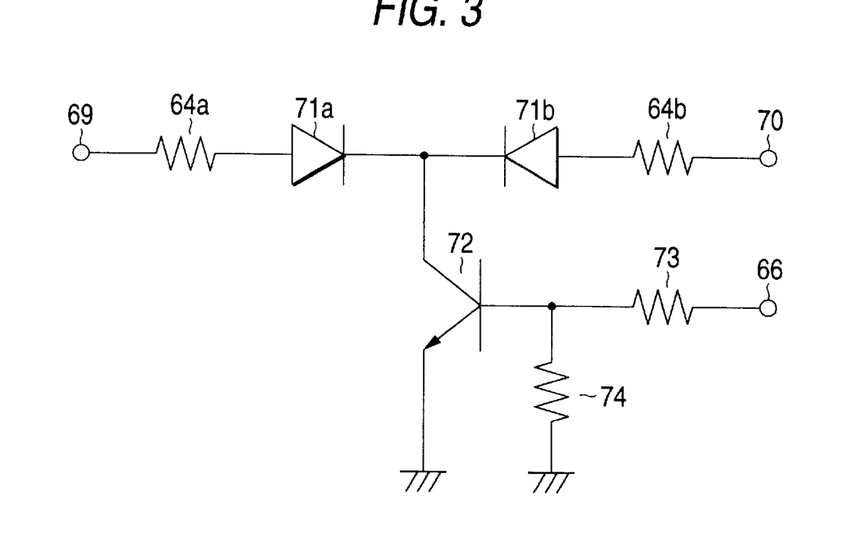
FIG. 3 is a circuit diagram showing a pertinent portion of the high frequency apparatus according to the second embodiment of the present invention.

FIG. 3 is a circuit diagram showing the dumping resistor 64 and the electronic switch 65. Terminals 69 and 70 are connected to both ends of the intermediate frequency filter 59. The dumping resistor 64 is composed of two-split resistors 64a and 64b. References 71a and 71b denote diodes whose cathodes are connected together respectively. A connection point between the cathodes and ground is connected by a transistor 72. A reference 66 denotes terminal of the electronic switch 65 that is connected to a base of the transistor 72 via a resistor 73. A reference 74 denotes a base resistance.

An operation of the high frequency apparatus constructed as above will be explained hereinbelow. A high frequency signal input from the input terminal 51 is passed through the bandpass filter 52, then amplified by the high frequency amplifier 53, and then passed through the bandpass filter 54. The signal passed through the bandpass filter 54 is mixed with an output signal of the local oscillator 56, which is decided by the PLL circuit 62 according to a signal input from the data input terminal 63, by the balanced mixer 58 and then a signal having a sum or difference frequency is output from the mixer 24. In other words, the high frequency signal input from the input terminal 51 can be tuned based on a data signal input from the data input terminal 63. The output of the balanced mixer 58 can be converted into a signal having a frequency bandwidth of 54.25 MHz to 58.75 MHz when it is passed through the intermediate frequency filter 59, then converted into an unbalanced output by the succeeding balance-unbalance converter 60, and then output from the output terminal 61.

Figure 4A:
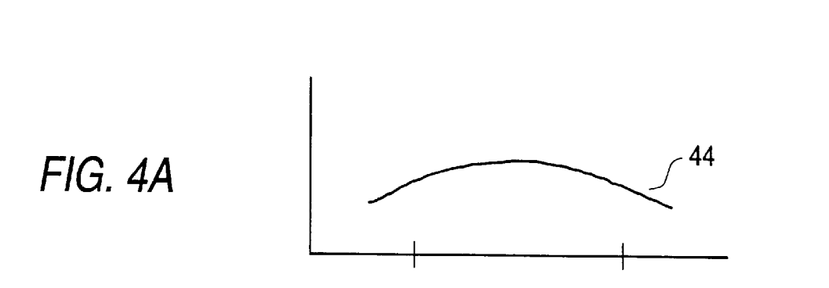
FIG. 4A is a characteristic curve view of a broad-band bandpass filter as a pertinent portion of the high frequency apparatus according to the second embodiment of the present invention.
Figure 4B:
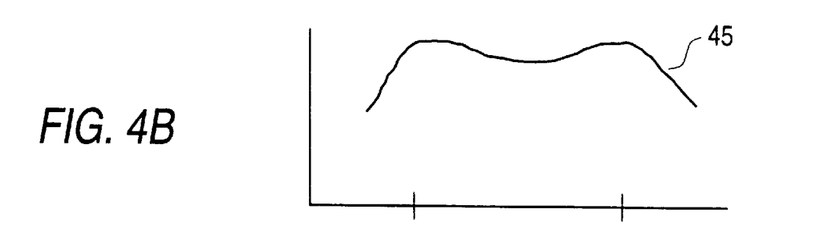
FIG. 4B is a characteristic curve view of a narrow-band bandpass filter as another pertinent portion of the high frequency apparatus according to the second embodiment of the present invention.
Figure 4C:
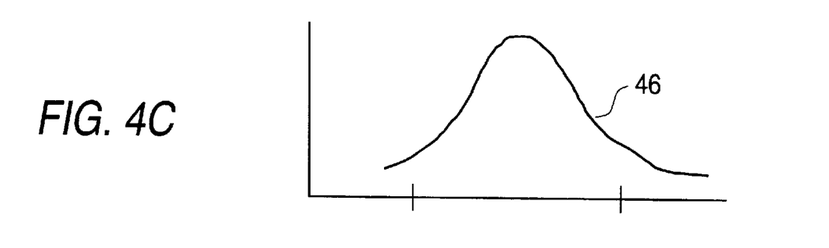
FIG. 4C is a characteristic curve view of an intermediate frequency filter as still another pertinent portion of the high frequency apparatus according to the second embodiment of the present invention.

The bandpass filters 52 and 54 are high frequency filters and are each made of a parallel circuit of an inductance and a capacitance. The bandpass filters 52 are 54 have passband characteristics shown as the characteristic 44 in FIG. 4A and the characteristic 45 in FIG. 4B, respectively. Therefore, the signals can be waveform-shaped to have such passband characteristics 44 and 45. The intermediate frequency filter is made of a parallel circuit of an inductance 75 (almost 1 μH) and a capacitance 76 (almost 8 pF) and has a passband characteristic shown as the characteristic 46 in FIG. 4C. Therefore, the signals can be waveform-shaped to have such passband characteristic 46. In other words, the transistor 72, the diode 71a, and the diode 71b are turned on by setting the control terminal 66 to a high level, so that both ends of the intermediate frequency filter 59 can be dumped by the dumping resistors 64a and 64b. In this fashion, the bandpass filters 52 and 54 can be adjusted such that the influence of the intermediate frequency filter 59 can be reduced to a negligible extent, i.e., can be made small as indicated by the characteristic 42b in FIG. 9B.

The unbalanced mixer may be employed as the mixer. In this case, the intermediate frequency filter is connected between an output of the unbalanced mixer and ground, and also the dumping resistor and the electronic switch are connected in series across both ends of the intermediate frequency filter. If such configuration is adopted, the high frequency apparatus can be implemented at low cost by employing the unbalanced mixer as the mixer. Also, the high frequency filter can be adjusted in the situation that the influence of the intermediate frequency filter can be reduced as much as possible by short-circuiting the output via the dumping resistor.

Embodiment 3

Figure 5:
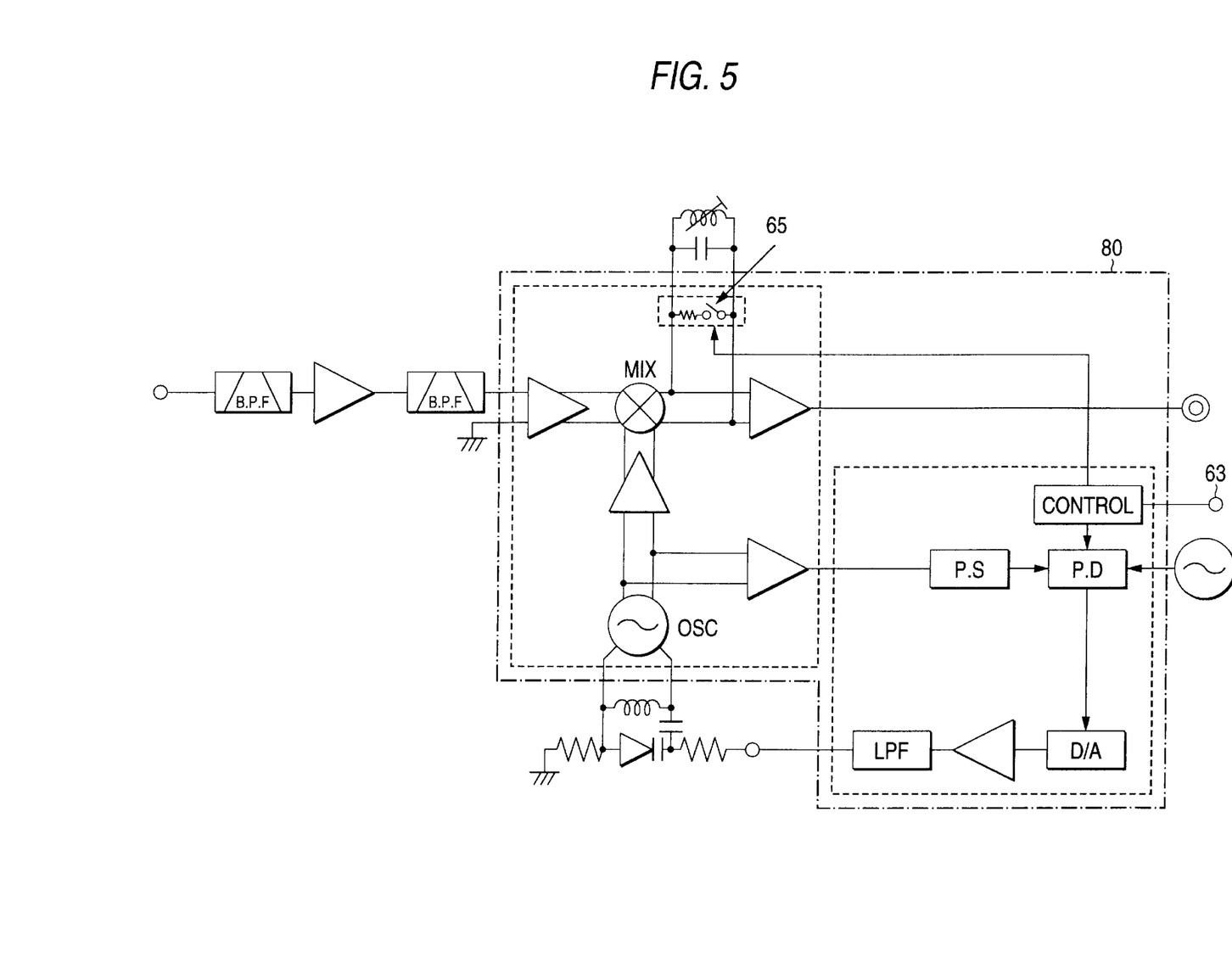
FIG. 5 is a block circuit diagram showing a high frequency apparatus according to a third embodiment of the present invention.

FIG. 5 shows a high frequency apparatus according to a third embodiment of the present invention. A difference of the third embodiment from the second embodiment reside in that the first integrated circuit 67 and the second integrated circuit 68 employed in the second embodiment are incorporated into one integrated circuit 80 in the third embodiment. Accordingly, since a signal as a control signal supplied to an electronic switch 65 can be derived from a data control terminal 63, there is no necessity of providing a control terminal 66 for the electronic switch 65 in the integrated circuit 80 particularly. In addition, since control of the electronic switch 65 can be performed by the signal derived from the data control terminal 63, a testing contactor pin can be omitted. As a result, defective contact caused by the contactor pin can be eliminated. Further, since the contactor pin can be omitted, a testing jig can be reduced in size and a lower cost can be achieved.

Embodiment 4

Figure 6:
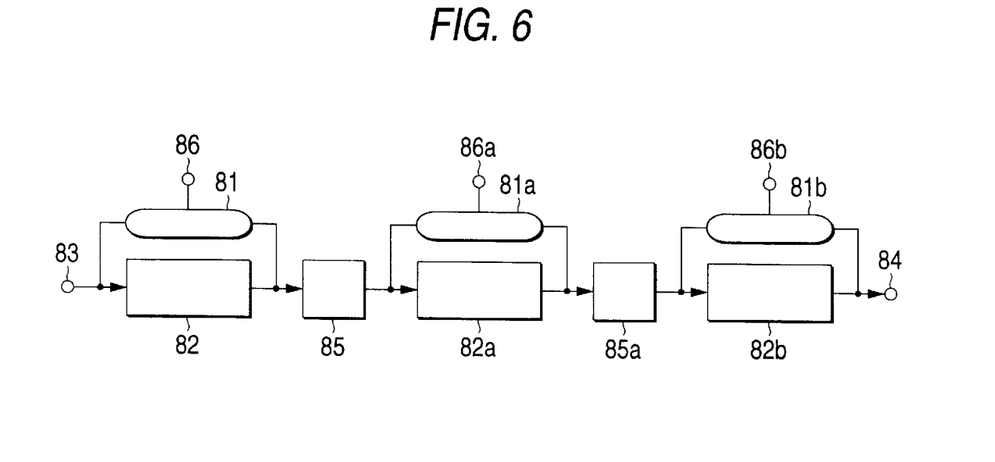
FIG. 6 is a block circuit diagram showing a high frequency apparatus according to a fourth embodiment of the present invention.

FIG. 6 shows a high frequency apparatus according to a fourth embodiment of the present invention. According to the fourth embodiment, such a high frequency apparatus can be provided that three parallel-connected bodies each consisting of an electronic switch 81 and an adjusting element 82 are connected in series between an input 83 and an output 84 via buffers 85. Opening and closing of the electronic switch 81 is controlled by a signal supplied from a control terminal 86. The adjusting element 82 can be adjusted by opening only the electronic switch 81 which is connected in parallel with the adjusting element 82 and closing other electronic switches 81*a*, 81*b* which are connected in parallel with other adjusting elements 82*a*, 82*b* respectively. Similarly, other adjusting elements 82*a*, 82*b* can be adjusted by executing the above operation sequentially.

Embodiment 5

Figure 7:
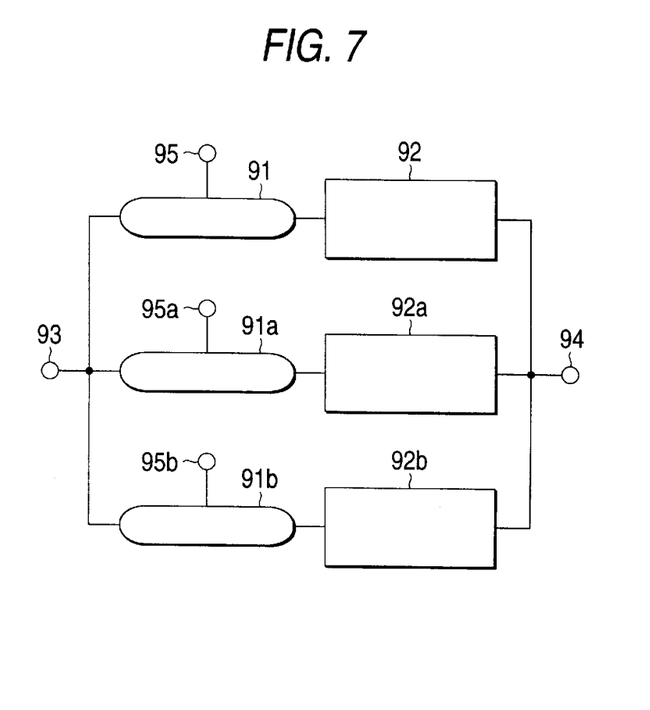
FIG. 7 is a block circuit diagram showing a high frequency apparatus according to a fifth embodiment of the present invention.

FIG. 7 shows a high frequency apparatus according to a fifth embodiment of the present invention. According to the fifth embodiment, such a high frequency apparatus can be provided that three series-connected bodies each consisting of an electronic switch 91 and an adjusting element 92 are connected in parallel between an input 93 and an output 94 and then, opening and close of the electronic switch 91 is controlled by a signal supplied from a control terminal 95. The adjusting element 92 can be adjusted by closing only the electronic switch 91 which is connected in series with the adjusting element 92 and opening all electronic switches 91*a*, 91*b* which are connected in series with other adjusting elements 92*a*, 92*b* respectively. In a similar way, other adjusting elements 92*a*, 92*b* can be adjusted by executing the above operation sequentially.

As described above, according to the present invention, the electronic switch which is disposed in the vicinity of the intermediate frequency filter and is used to make the passband characteristic of the intermediate frequency filter flat when both ends of the electronic switch of the electronic switch can be controlled from the external side. Since the electronic switch is disposed in the vicinity of the intermediate frequency filter, the high frequency apparatus can be provided which includes no uncertain element like the contactor pin in the prior cart and includes small adjusting error of the high frequency filter.

Further, since opening and close of the electronic switch is carried out indirectly by the control signal externally, influence upon the high frequency signal passing through the intermediate frequency filter can be greatly reduced.

Moreover, there is no need of employing a contactor pin, so that production facilities can be simplified and also lower cost of the production facilities can be achieved.

What is claimed is:
1. A high frequency apparatus comprising:
an input terminal;
an adjustable high frequency filter to which a signal input into the input terminal is supplied;
a mixer having one input and an other input, said one input receiving an output signal of the high frequency filter and said one other input receiving an output signal of local oscillator;
an intermediate frequency filter to which an output signal of the mixer is supplied;
an output terminal to which an output signal of the intermediate frequency filter is supplied;
and an electronic switch provided in a vicinity of the intermediate frequency filter and connected across both ends of said intermediate frequency filter, said electronic switch having a pair of contacts and being operable to make a passband characteristic of the intermediate frequency filter substantially flat by closing both contacts so that an adjustment error of the high frequency filter is reduced; and
means for opening and closing of the electronic switch to close the switch for adjustment of the high frequency filter and open the switch after the adjustment.

2. A high frequency apparatus comprising:
an input terminal;
a high frequency filter to which a signal input into the input terminal is supplied;
a mixer having one input and an other input, said one input receiving an output signal of the high frequency filter and said other input receiving an output signal of a local oscillator;
an intermediate frequency filter to which an output signal of the mixer is supplied;
an output terminal to which an output signal of the intermediate frequency filter is supplied;
an electronic switch provided in a vicinity of the intermediate frequency filter and connected across both ends of said intermediate frequency filter, said electronic switch having a pair of contacts and being operable to make a passband characteristic of the intermediate frequency filter substantially flat by closing both contacts so that an adjustment error of the high frequency filter is reduced; and
means for opening and closing of the electronic switch to close the switch for adjustment of the high frequency filter and open the switch after the adjustment; and
wherein said mixer, said local oscillator, and said electronic switch are incorporated in a single integrated circuit.

3. A high frequency apparatus according to claim 2, further comprising a PLL circuit connected to the local oscillator, said PLL circuit being operable to control an oscillation frequency of the local oscillator and opening and closing of the electronic switch by a signal which is input into the PLL circuit via a data input terminal.

4. A high frequency apparatus according to claim 2, wherein a balanced mixer is employed as the mixer, the intermediate frequency filter is connected between outputs of the balanced mixer, and a dumping resistor and the electronic switch are connected in series across both ends of the intermediate frequency filter.

5. A high frequency apparatus according to claim 2, wherein an unbalanced mixer is employed as the mixer, the intermediate frequency filter is connected between an output of the unbalanced mixer and ground, and a dumping resistor and the electronic switch are connected in series across both ends of the intermediate frequency filter.

* * * * *

UNITED STATES PATENT AND TRADEMARK OFFICE
CERTIFICATE OF CORRECTION

PATENT NO. : 6,233,442 B1
DATED : May 15, 2001
INVENTOR(S) : Koda et al.

It is certified that error appears in the above-identified patent and that said Letters Patent is hereby corrected as shown below:

Column 2,
Line 59, delete "oscillator," and insert -- oscillator. An --.

Column 3,
Line 33, delete "output, opening" and insert -- output. Opening --.
Line 40, after "elements" (first occurrence) insert -- , -- (comma).
Line 47, delete "output, wherein." and insert -- output. --.

Column 5,
Line 44, delete "and," and insert -- and an --.

Column 6,
Line 5, after "denotes" insert -- the control --.

Column 7,
Lines 36-37, delete "94 and then, opening and close" and insert -- 94. Opening and closing --.
Lines 49-50, delete "of the electronic switch can be controlled from the external side." and insert -- are closed, and then opening and closing of the electronic switch can be controlled from the external side. --.
Line 53, delete "like" and insert -- (like --.
Line 54, delete "cart" and insert -- art) --.
Line 56, delete "close" and insert -- closing --.

Column 8,
Line 23, delete "a" (first occurrence) and insert -- an adjustable --.
Lines 49-54, delete claim 3 in its entirety and insert the attached claim 3.
Lines 55-60, delete claim 4 in its entirety and insert the attached claim 4.
Lines 61-66, delete claim 5 in its entirety and insert the attached correct claim 5.

-- 3. A high frequency apparatus comprising:
an input terminal;
a high frequency filter to which a signal input into the input terminal is supplied;
a mixer having one input and an other input, said one input receiving an output
    signal of the high frequency filter and said other input receiving an output
signal of a local oscillator;

UNITED STATES PATENT AND TRADEMARK OFFICE
CERTIFICATE OF CORRECTION

PATENT NO. : 6,233,442 B1
DATED : May 15, 2001
INVENTOR(S) : Koda et al.

It is certified that error appears in the above-identified patent and that said Letters Patent is hereby corrected as shown below:

an intermediate frequency filter to which an output signal of the mixer is supplied;
an output terminal to which an output signal of the intermediate frequency filter is supplied;
an electronic switch provided in a vicinity of the intermediate frequency filter and connected across both ends of said intermediate frequency filter, said electronic switch having a pair of contacts and being operable to make a passband characteristic of the intermediate frequency filter substantially flat by closing both contacts so that an adjustment error of the high frequency filter is reduced;
a PLL circuit connected to the local oscillator, said PLL circuit being operable to control an oscillation frequency of the local oscillator and opening and closing of the electronic switch by a signal which is input into the PLL circuit via a data input terminal;
wherein opening and closing of the electronic switch is controlled externally; and,
wherein said mixer, said local oscillator, and said electronic switch are incorporated in a single integrated circuit. --

-- 4. A high frequency apparatus comprising:
an input terminal;
a high frequency filter to which a signal input into the input terminal is supplied;
a mixer having one input and an other input, said one input receiving an output signal of the high frequency filter and said other input receiving an output signal of a local oscillator;
an intermediate frequency filter to which an output signal of the mixer is supplied;
an output terminal to which an output signal of the intermediate frequency filter is supplied;
an electronic switch provided in a vicinity of the intermediate frequency filter and connected across both ends of said intermediate frequency filter, said electronic switch having a pair of contacts and being operable to make a passband characteristic of the intermediate frequency filter substantially flat by closing both contacts so that an adjustment error of the high frequency filter is reduced;
wherein opening and closing of the electronic switch is controlled externally; and,
wherein said mixer, said local oscillator, and said electronic switch are incorporated in a single integrated circuit;
and wherein a balanced mixer is employed as the mixer, the intermediate frequency filter is connected between outputs of the balanced mixer, and a dumping resistor and the electronic switch are connected in series across both ends of the intermediate frequency filter. --

UNITED STATES PATENT AND TRADEMARK OFFICE
CERTIFICATE OF CORRECTION

PATENT NO. : 6,233,442 B1
DATED : May 15, 2001
INVENTOR(S) : Koda et al.

It is certified that error appears in the above-identified patent and that said Letters Patent is hereby corrected as shown below:

-- 5. A high frequency apparatus comprising:
an input terminal;
a high frequency filter to which a signal input into the input terminal is supplied;
a mixer having one input and an other input, said one input receiving an output signal of the high frequency filter and said other input receiving an output signal of a local oscillator;
an intermediate frequency filter to which an output signal of the mixer is supplied;
an output terminal to which an output signal of the intermediate frequency filter is supplied;
an electronic switch provided in a vicinity of the intermediate frequency filter and connected across both ends of said intermediate frequency filter, said electronic switch having a pair of contacts and being operable to make a passband characteristic of the intermediate frequency filter substantially flat by closing both contacts so that an adjustment error of the high frequency filter is reduced;
wherein opening and closing of the electronic switch is controlled externally; and,
wherein said mixer, said local oscillator, and said electronic switch are incorporated in a single integrated circuit; and
wherein an unbalanced mixer is employed as the mixer, the intermediate frequency filter is connected between an output of the unbalanced mixer and ground, and a dumping resistor and the electronic switch are connected in series across both ends of the intermediate frequency filter. --

Signed and Sealed this

Fourteenth Day of May, 2002

*Attest:*

*Attesting Officer*

JAMES E. ROGAN
*Director of the United States Patent and Trademark Office*